Aug. 2, 1966 J. E. PRICE 3,264,493
SEMICONDUCTOR CIRCUIT MODULE FOR A
HIGH-GAIN, HIGH-INPUT
IMPEDANCE AMPLIFIER
Filed Oct. 1, 1963 2 Sheets-Sheet 1

JOHN E. PRICE
*INVENTOR.*
BY Roger S. Borovoy
ATTORNEY

Aug. 2, 1966 J. E. PRICE 3,264,493

SEMICONDUCTOR CIRCUIT MODULE FOR A HIGH-GAIN, HIGH-INPUT IMPEDANCE AMPLIFIER

Filed Oct. 1, 1963 2 Sheets-Sheet 2

JOHN E. PRICE
INVENTOR.

BY Roger S. Borovoy
ATTORNEY

United States Patent Office 3,264,493
Patented August 2, 1966

3,264,493

SEMICONDUCTOR CIRCUIT MODULE FOR A HIGH-GAIN, HIGH-INPUT IMPEDANCE AMPLIFIER

John E. Price, Palo Alto, Calif., assignor to Fairchild Camera and Instrument Corporation, Syosset, N.Y., a corporation of Delaware Filed Oct. 1, 1963, Ser. No. 313,072
2 Claims. (Cl. 307—88.5)

This invention relates to a semiconductor circuit module for a high gain, high input impedance amplifier. More specifically, a preferred embodiment of the invention provides an integrated circuit module having all the essential components necessary for such an amplifier, integrated on a single wafer of semiconductor.

Very recently a new type of semiconductor component, commonly known as an insulated-gate field-effect device, has been developed. Such devices, and circuits employing them, are fully described in copending application Ser. No. 288,786 of Frank M. Wanlass, assigned to the same assignee as this invention. Briefly, an external insulated-gate field-effect semiconductor device is formed in a wafer of semiconductor material, such as silicon. The wafer is doped in a conventional manner with impurities of one conductivity type. Also formed in the silicon wafer are regions of the opposite conductivity type which extend to its upper surface. These regions are formed in a conventional manner by diffusing impurities into the wafer of the appropriate conductivity type. An insulating layer, preferably the oxide of silicon, is formed on the surface of the wafer, such as by oxidation, and is located at least above the area of the wafer between the diffused regions. A drain electrode is located on the surface of the wafer in contact with one of the diffused regions which will serve as the drain. A source electrode is placed in contact with the other of the diffused regions. A gate electrode is then formed atop the insulating layer over the channel between the source and drain regions. These three electrodes are used to make electrical contact with the device.

The semiconductor circuit module of this invention, useful for a high gain, high input impedance amplifier, comprises: (a) An external, insulated-gate field-effect device, described above, having a source, a drain, and an insulated gate; (b) a transistor having a collector of one conductivity type, a base of the opposite conductivity type, and an emitter of the same conductivity type; (c) means coupling the base to one of the source and the drain; (d) means coupling the collector to the other of the source and drain; (e) input means for applying a signal to the insulated gate; and (f) output means coupled to the emitter.

The module of this invention has numerous advantages. Since the input to the module is through the insulated gate, a high input impedance is assured. This avoids loading other circuits whose output may be connected to the input of the module of this invention. The circuit has a high transconductance which provides a high output current capability, thus making the module useful for high gain circuitry. Finally, the circuit embodying the invention operates in the grounded collector mode, eliminating the need for subunit isolation in multiple-module integrated circuitry.

For a better understanding of the invention, its advantages, and its operation, the more detailed description which follows is helpful. Reference is made to the drawings, in which.

Figure 1:
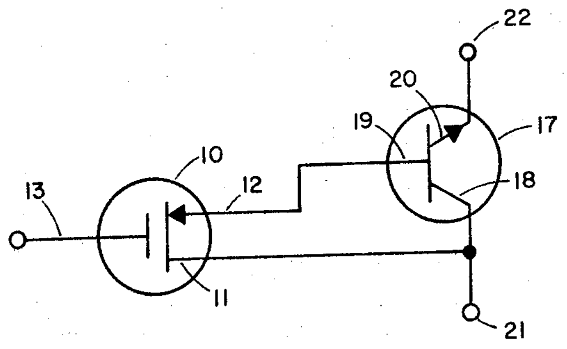
FIG. 1 is a schematic circuit diagram of the module of this invention.

Referring now to the drawings, and in particular to FIG. 1, the semiconductor circuit module of this invention comprises an external, insulated-gate field-effect device 10 having a source 11, a drain 12, and an insulated gate 13. As more clearly shown in FIG. 2, the device includes a substrate 14 of one conductivity type. In the embodiment used for illustrative purposes, the substrate is N-type; it is to be understood, however, that the substrate could also have been P-type with the conductivity types of the remaining regions being reversed. As is known in the art, the biasing polarities are then reversed. The wafer used for substrate 14 may be uniformly doped with N-type impurities during its growth, or may be doped thereafter, both as well known in the art.

Figure 2:
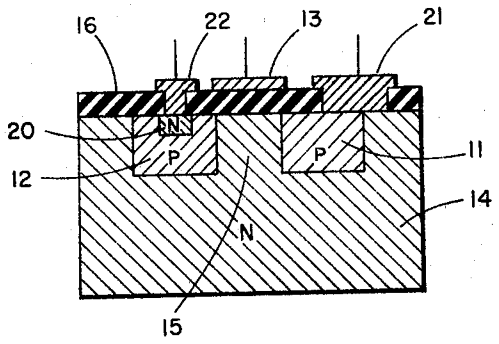
FIG. 2 is a cross-sectional elevation view showing an integrated structure of the circuit module of this invention.

The spaced source and drain regions 11 and 12 shown in FIG. 2 are formed, such as by diffusion, in substrate 14, and extend to its surface, as shown. The source and drain regions are of the opposite conductivity type from the substrate 14, i.e. P-type in the example; they define an N-type channel region 15 between them.

On the surface of the wafer an insulating layer 16 is formed. Where the semiconductor material is silicon, this insulating layer is preferably the oxide of silicon. Silicon oxide may be conventionally formed by oxidation of the silicon wafer itself, as is well known in the art. It is important that this insulating layer cover at least the channel surface between the source and drain regions 11 and 12, respectively, as shown in FIG. 2. However, it may cover the entire surface of the wafer except where contacts to the silicon regions are to be made. The insulated gate 13 is disposed upon this insulating layer over channel region 15. This gate may be aluminum or other metal deposited atop the insulating layer by methods well known in the art. For example, the metal may be deposited over the entire surface of the insulating layer 15, and etched away where it is unwanted.

Referring again to FIG. 1, the circuit also includes a transistor 17 having a collector 18 of one conductivity type, N-type in the illustrated emobidment, a base 19 of the opposite conductivity type, e.g. P-type, and an emitter 20 of the same conductivity type as the collector, i.e. N-type. The formation of this transistor in the single wafer of semiconductor which also contains the field-effect device is shown in FIG. 2. The substrate 14 itself serves as the collector 18. One of the source and drain regions 11 or 12, e.g. drain region 12, serves as the base 19 of the transistor. The emitter 20, of the same conductivity type as wafer 14, is another diffused region formed in the same one of the source and drain regions which serves as the base, i.e., the drain region 12. This emitter region may be formed by conventional masking and diffusion steps well known in the art.

In the embodiment of FIG. 1, the base of the transistor is coupled to the drain region of the insulated-gate field-effect device. In the integrated structure of FIG. 2, no external drain-base coupling is required because the drain 12 and the base of the transistor are formed in the same region 12. Where the base of the transistor and one of the source and drain regions of the insulated-gate field-effect device are not the same region, however, an external interconnection may be required between the base and that region. In that event an external lead, bonded to each of the two regions, may be used. This lead may be metalization deposited over the oxide, as described in U.S. Patent 2,981,877 issued to Robert N. Noyce and assigned to the same assignee as this invention.

As shown in FIG. 1, the collector 18 of transistor 17 is coupled to the other of the source and drain regions 11 and 12 of the insulated-gate field-effect device 10 (i.e., the one not coupled to the base). In the FIG. 1 embodiment, that region is source 11. For simplicity, this connection may be formed in the integrated circuit of FIG. 2 using a common electrode 21 in contact with the surfaces of both source region 11 and substrate 14. Electrode 21 is deposited through an aperture etched in insulating layer 16 to contact source region 11 and substrate 14 at their common upper surface by methods well known in the art.

The circuit module employs input means for applying a signal to the insulated gate 13. In the structure of FIG. 2, these input means comprise a gate electrode 13 in contact with the insulating layer 16. The circuit module also requires output means for taking the output signal from the module. The output means is coupled to emitter 20 and may, for example, comprise emitter electrode 22. The emitter electrode is also formed by conventional techniques of depositing metal through an aperture etched in insulating layer 16.

Figure 3:
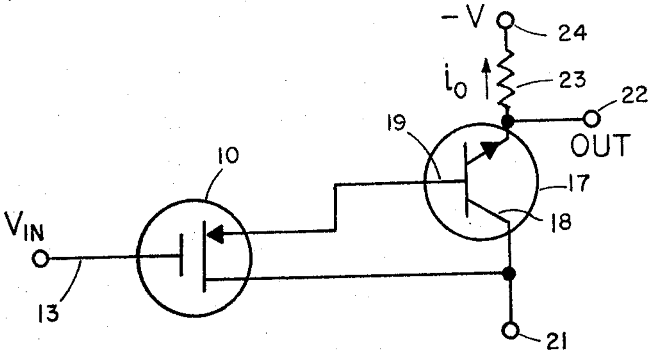
FIG. 3 is a schematic circuit diagram of a circuit using the module of this invention.

A circuit using the module of the invention is shown in FIG. 3. The insulated-gate field-effect device 10 and transistor 17 are connected in the same manner as shown in FIG. 1. Resistor 23 has been connected between emitter terminal 22 and supply voltage terminal 24. Terminal 21 is normally connected to ground. With the illustrated polarities of the insulated-gate field-effect device and the transistor, a negative biased voltage supply, —V, is connected to terminal 24. The input signal is fed to input terminal 13, which is the gate of the field-effect device 10. Because this gate is insulated from the semiconductor body, it acts as a high impedance input. The channel (drain-source) current of the field-effect device drives the base of NPN transistor 17. With input 13 at ground potential, the source-drain current through the channel of the insulated-gate field-effect device 10 is very small, for example less than 10–9 amps. Consequently, there is equally little base current flowing into transistor 17, placing the transistor in its cut-off condition. In this condition, the output voltage at terminal 22 is approximately —V.

As soon as the input terminal 13 is biased negatively, channel current will flow through the insulated-gate field-effect device 10. This current flowing into the base of transistor 17 turns the transistor on, and thus drives the output terminal 22 from —V nearly to ground. It is thus apparent that a negative input signal to terminal 13 produces a positive voltage signal at output terminal 22. Therefore the entire module exhibits a voltage inversion from input 13 to output 22.

It is not necessary that transistor 17 be operated only in the saturation and cut-off regions. The transistor may also be biased in the active region to obtain simple amplification between input 13 and output 22. The module then operates in a manner analogous to a transistor alone, but with advantages not possible with just a transistor. The voltage-current characteristics of an exemplary circuit module of this invention, connected as shown in FIG. 3, may be seen in FIG. 4.

Figure 4:
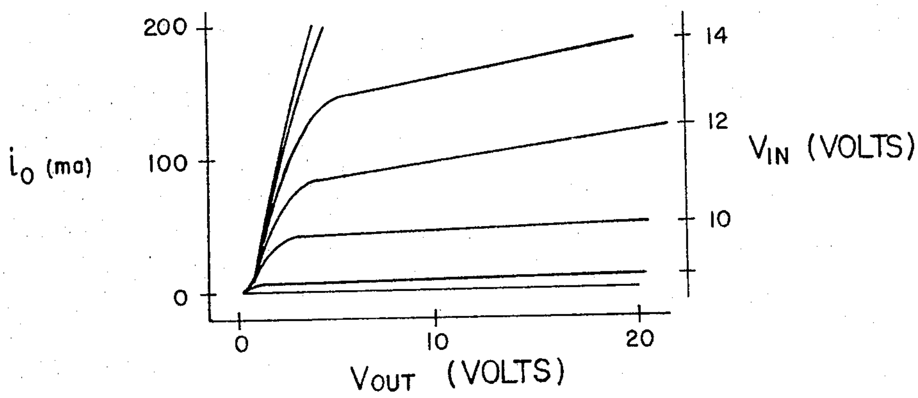
FIG. 4 is a plot of the i–v characteristics of the circuit of FIG. 3.

FIG. 4 is a plot of resistor current $i_0$ through resistor 23 (FIG. 3) in milliamps. (ma.), versus output voltage at terminal 22 (FIG. 3), in volts. Each of the four curves shown in FIG. 4 was obtained at a different input voltage $V_{in}$. Input voltages of 8 volts, 10 volts, 12 volts, and 14 volts were used. In this manner, a family of *i–v* curves were obtained similar to those which would be obtained with a transistor alone. This graph shows that the module of this invention performs as an amplifier similar to a transistor. The amplifier comprising the module of this invention, however, in contrast to a transistor, has a very high input impedance since the input signal is applied to the insulated-gate of the field-effect device. The device also has been found to have a high transconductance, providing a high output current capability useful where a large driving power is required, such as in high-gain circuitry. Moreover, for high frequency operations, both input and output capacitances of the module of this invention are desirably low.

As seen in FIGS. 1 and 3, the module of this invention is operated in the grounded collector mode. This eliminates the need for collector isolation and makes possible the formation of many devices, such as the one shown in FIG. 2, in a single substrate of silicon. In such integrated circuitry, a plurality of pairs of source and drain regions, such as source region 11 and drain region 12, may be diffused into a single wafer or substrate of silicon. The proper interconnections between the various amplifier stages are deposited over the insulating layer 16 to form an integrated circuit structure containing a plurality of the individual modules of this invention, as described in U.S. Patent 2,981,877, mentioned above.

Figure 5:
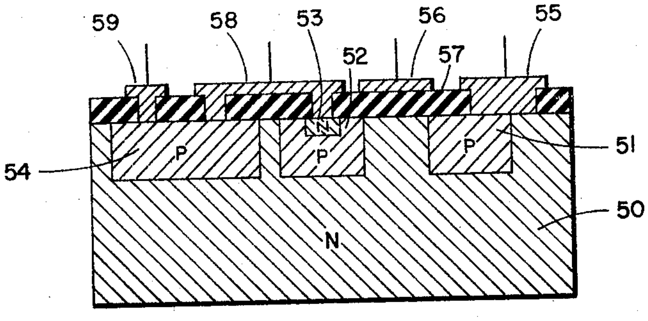
FIG. 5 is a cross-sectional elevation view of an integrated circuit module embodying the circuit of FIG. 3.

The circuit of FIG. 3, including resistor 23, may be formed in a single N-type wafer of semiconductor material, e.g., silicon as shown in FIG. 5. Substrate region 50 contains diffused P-type source region 51 and drain region 52. Also formed in wafer 50, such as by diffusion, is a resistor region 54, also P-type so that it is isolated by a PN junction from N-type substrate 50. This diffusion may be carried out simultaneously with the diffusion of source and drain regions 51 and 52. The common collector and source contact 55 is formed in the same manner as before. Similarly the insulated-gate electrode 56 is deposited above insulating layer 57 as before. In this integrated circuit, a single electrode 58 is used to make contact with emitter 53 and one terminal of diffused resistor 54. To accomplish this, apertures are etched in the oxide over resistor 54, and metal, such as aluminum, is deposited on the surface of the oxide and into the apertures to make contact with the underlying silicon. This interconnection 58 is thus formed in accordance with the technology of U.S. Patent 2,981,877. Finally, an aperture is etched in the insulating layer 57 for resistor contact 59. This contact corresponds to terminal 24 in FIG. 3. Similarly, electrode 55 in FIG. 5 corresponds to terminal 21 in FIG. 3; insulated gate terminal 56 in FIG. 5 corresponds to input terminal 13 in FIG. 3; and electrode 58 in FIG. 5 corresponds to output terminal 22 in FIG. 3. Therefore the entire circuit of FIG. 3 is formed on the single wafer of semiconductor material 50 shown in FIG. 5.

As will be obvious to one skilled in the art, many modifications in the circuit and method of fabricating same in a wafer of semiconductor material may be made without departing from the spirit and scope of the invention. Therefore, the only limitations upon that scope are those expressed in the claims which follow.

What is claimed is:

1. A semiconductor circuit module for a high-gain, high input impedance amplifier, which comprises:

an external, insulated-gate field-effect device having a source, a drain, and an insulated gate, said device including a substrate of one conductivity type, a pair of regions formed by diffusion in said substrate and extending to the surface thereof, one being a source and the other a drain, said regions being of the opposite conductivity type from said substrate and defining a channel region therebetween, an insulating layer disposed on the surface of said channel between said regions and a metallic electrode formed on said insulating layer, a transistor having a collector of one conductivity type which is said substrate, a base of the opposite conductivity type, which is one of said pair of regions, and an emitter of said one conductivity type, said emitter comprising a third diffused region formed within said one of said regions and extending to the surface thereof, said emitter being of the same conductivity type as said substrate, means coupling the other of said pair of regions to said substrate, said means comprising a common electrode in contact with both the other of said drain and said substrate, means for applying a direct coupled input signal to said metallic electrode, and an output electrode coupled to said emitter region.

2. A semiconductor circuit module for a high-gain, high input impedance amplifier, which comprises:

an external, insulated-gate field-effect device having a source, a drain, and an insulated gate, said device including a substrate of one conductivity type, a pair of regions and a resistor region of opposite conductivity type formed in said substrate and extending to the surface thereof, one of said pair of regions being a source and the other a drain, said regions defining a channel region therebetween, and an insulating layer disposed on the surface of said channel between said regions and a metallic electrode formed on said insulating layer, a transistor having a collector of one conductivity type which is said substrate, a base of the opposite conductivity type, which is one of said pair of regions, and an emitter of said one conductivity type, said emitter comprising a third diffused region formed in said one of said regions and extending to the surface thereof, said third diffused region being of the same conductivity type as said substrate, means coupling the other of said pair of regions to said substrate, said means comprising a common electrode in contact with the surfaces of both said other of said pairs of regions and said substrate, means for applying a direct coupled input signal to said metallic electrode, an output electrode coupling said emitter region in series with said resistor region, and means for applying a voltage across said series-connected resistor, emitter, and collector.

References Cited by the Examiner

UNITED STATES PATENTS

| | | | |
|---|---|---|---|
| 2,612,567 | 9/1952 | Stuetzer | 317—235 |
| 2,900,531 | 8/1959 | Wallmark | 317—235 |
| 2,985,804 | 5/1961 | Buie | 317—235 |
| 3,070,762 | 12/1962 | Evans | 317—235 |
| 3,138,743 | 6/1964 | Kilby | 317—101 |
| 3,168,649 | 2/1965 | Meyers | 307—88.5 |
| 3,173,101 | 3/1965 | Stelmak | 307—88.5 |
| 3,197,710 | 7/1965 | Lin | 307—88.5 |
| 3,222,610 | 12/1965 | Evans et al. | 317—235 |

OTHER REFERENCES

Electronic Design, "Product Survey: Field Effect Transistors," Apr. 26, 1963, pp. 66–69.

Electronics, "How To Get Maximum Input Impedance With Field-Effect Transistors," Mar. 8, 1963, pp. 44–46.

JOHN W. HUCKERT, *Primary Examiner.*

J. D. CRAIG, *Assistant Examiner.*